United States Patent
Neal et al.

(10) Patent No.: US 8,855,836 B2
(45) Date of Patent: Oct. 7, 2014

(54) METHODS AND SYSTEMS FOR IMPLEMENTING SOFTWARE-SELECTABLE MULTIPURPOSE AIRCRAFT PINS

(75) Inventors: James M. Neal, Bothell, WA (US); Pat Biggar, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/530,014

(22) Filed: Jun. 21, 2012

(65) Prior Publication Data

US 2013/0345904 A1 Dec. 26, 2013

(51) Int. Cl.
*G01C 23/00* (2006.01)
*G06F 13/00* (2006.01)
*H01L 25/00* (2006.01)

(52) U.S. Cl.
USPC ................... 701/3; 710/316; 326/101

(58) Field of Classification Search
CPC ........ B64D 47/00; G06F 13/38; H03K 17/18; H03K 17/0828
USPC .............. 701/3; 710/305, 316, 306, 310, 317; 326/38, 93, 62, 41, 47, 101
See application file for complete search history.

(56) References Cited

U.S. PATENT DOCUMENTS

| | | | |
|---|---|---|---|
| 4,319,487 A | 3/1982 | Haase et al. | |
| 4,654,789 A | 3/1987 | Nusinov et al. | |
| 6,886,066 B2 * | 4/2005 | Ishii | 710/305 |
| 7,813,150 B2 * | 10/2010 | Cuadra et al. | 363/21.15 |
| 8,493,240 B1 * | 7/2013 | Carrico | 340/971 |
| 2009/0315586 A1 | 12/2009 | Swoboda | |
| 2010/0327195 A1 * | 12/2010 | Huang et al. | 250/551 |

FOREIGN PATENT DOCUMENTS

KR 100764062 B1 10/2007

OTHER PUBLICATIONS

Circlessivaramakrishna Anumolu; Things to be taken care for sharing pins for test mode [http://sivaramakrishna09.blogspot.com/2012/02/things-to-be-taken-care-for-sharing.html?z], Feb. 2, 2012.
EP Search Report, EP 13 169 819.3 dated Sep. 26, 2013.
EP Examination Report, for application No. EP 13 169 819.3 dated Nov. 20, 2013.
EP Examination Report, for application No. EP 13 169 819.3-1810 dated Sep. 4, 2014.
EP Summons to Oral Proceedings for Application No. EP 13169819.3 dated Jun. 25, 2014.

* cited by examiner

*Primary Examiner* — Muhammad Shafi
(74) *Attorney, Agent, or Firm* — Ingrassia Fisher & Lorenz P.C.

(57) ABSTRACT

An avionics system configurable through software to support more than one pin-out design. An exemplary system includes configuration pins that receive one or more signals from an external source, one or more subcircuits, one or more multipurpose input/output pins, a controller that determines a configuration mode based on one or more received signals, and a selection circuit that connects one of the subcircuits with one or more of the multipurpose input/output pins, based on the determined configuration mode.

1 Claim, 4 Drawing Sheets

METHODS AND SYSTEMS FOR IMPLEMENTING SOFTWARE-SELECTABLE MULTIPURPOSE AIRCRAFT PINS

BACKGROUND OF THE INVENTION

Current avionics systems have a fixed aircraft pin-out design in which each pin is assigned a unique signal assignment. Thus, some avionics systems have all of the aircraft pins defined, leaving no spare pins available for new functions to be defined. When this is the case, certain signals need to be removed before adding the new functions to the system interface. This results in two separate hardware configurations and part numbers to support the two aircraft pin-out designs. The new part number is most likely not compatible with the old aircraft pin-out and the old part number is not compatible with the new aircraft pin-out.

SUMMARY OF THE INVENTION

The present invention provides a single avionics system interface that is configurable through software to support more than one pin-out design. An exemplary avionics system interface includes configuration pins that receive one or more signals from an external source, one or more subcircuits, one or more output pins, a controller that determines a configuration mode based on one or more received signals and a switch that connects one of the subcircuits with one or more of the output pins, based on the determined configuration mode.

In one aspect of the invention, the one or more signals includes one or more voltage values at the one or more configuration pins.

In another aspect of the invention, the switch includes an optocoupler.

BRIEF DESCRIPTION OF THE DRAWINGS

Preferred and alternative embodiments of the present invention are described in detail below with reference to the following drawings.

DETAILED DESCRIPTION OF THE INVENTION

Figure 1:
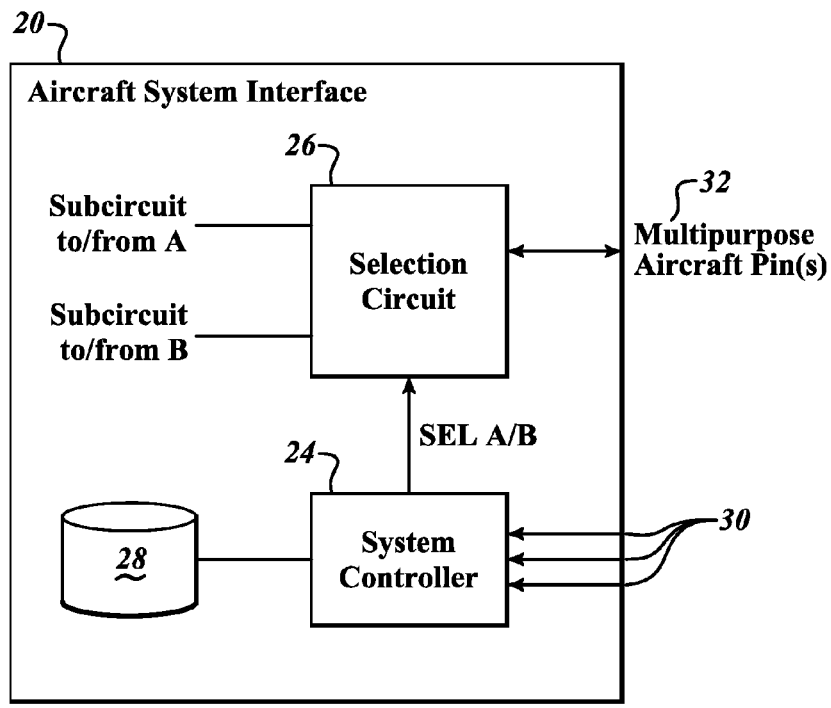
FIG. 1 is a block diagram of an exemplary system formed in accordance with an embodiment of the present invention.

FIG. 1 shows a block diagram of a portion of an exemplary aircraft system interface 20 that is capable of providing different functions/operations at one or more of the pins of the interface 20. The enhanced ground proximity warning system (EGPWS) produced by Honeywell, Inc. is an example of where the interface 20 may be used.

The interface 20 includes a system controller 24 that is in signal communication with a selection circuit 26, a memory 28, and one or more configuration pins 30. The system controller 24 determines operation of the selection circuit 26, based on an interpretation of voltage values at the configuration pin(s) 30 and compared against a configuration index stored in the memory 28. The selection circuit 26 determines how input or output (input/output) pin(s) 32 are going to interact with different systems (subcircuits A, B) of the interface 20, based on the controller-determined operation.

Figure 2:
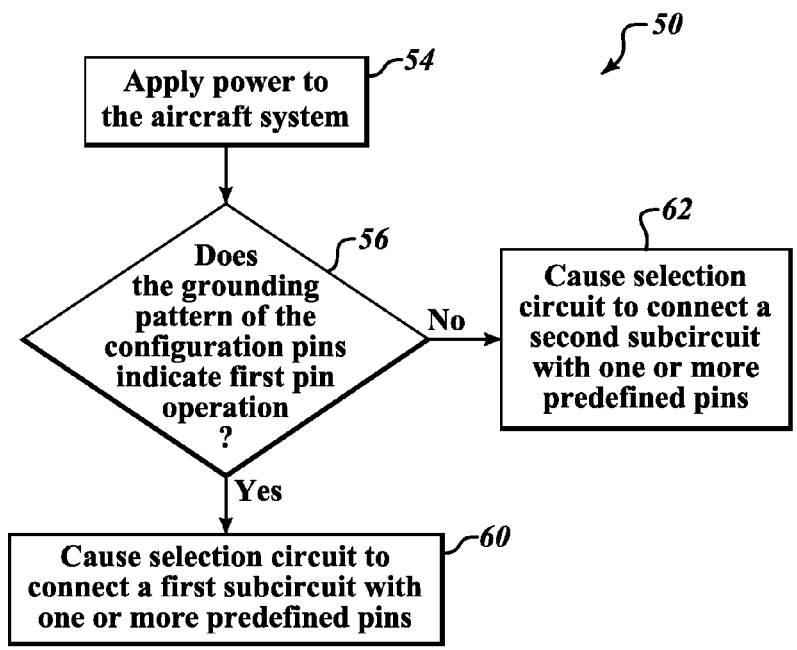
FIG. 2 is a flow diagram of an exemplary process performed by the system shown in FIG. 1.

FIG. 2 shows a flow diagram of an exemplary process 50 performed by the interface 20 (FIG. 1). First, at a block 54, power is applied to the aircraft system interface 20. Then, at a decision block 56, the system controller 24 analyzes the grounding (or signal) pattern of the configuration pin(s) 30 and, at a block 60, instructs the selection circuit 26 to connect the first subcircuit A to the input/output pin(s) 32, if the grounding pattern indicates a first subcircuit (pin) operation. At a block 62, the second subcircuit B is connected to the input/output pin(s) 32, if the grounding pattern indicates a second subcircuit (pin) operation.

Figure 3:
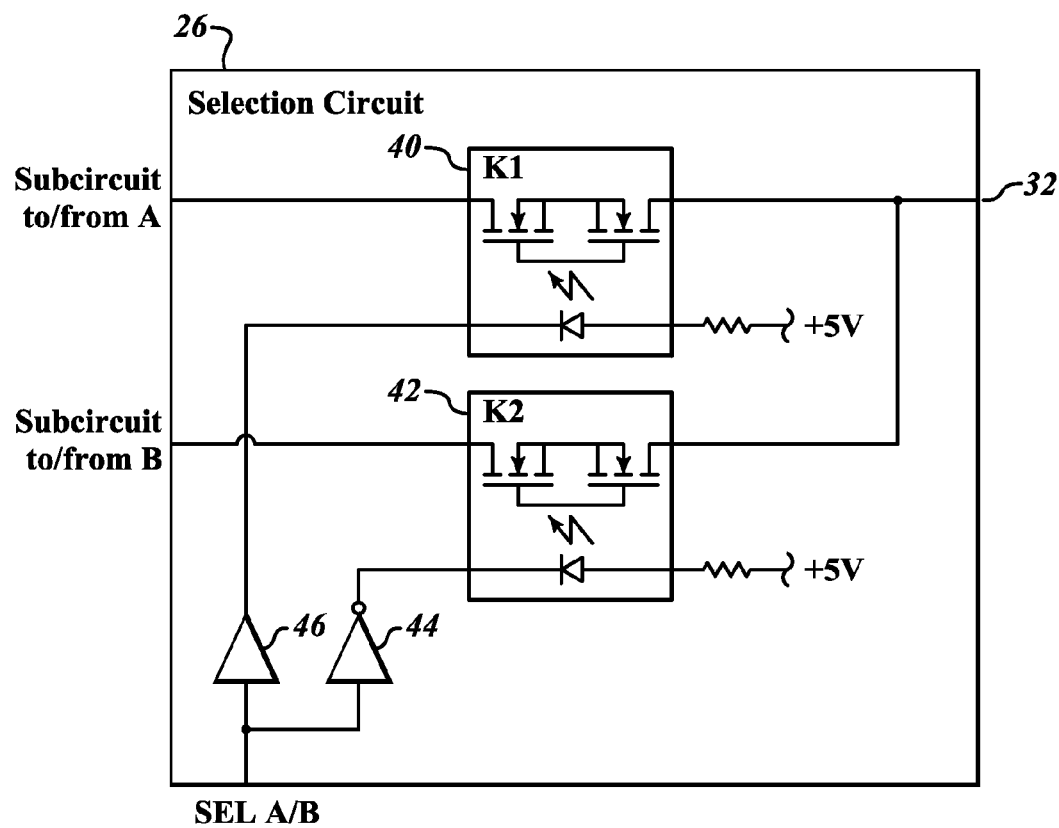
FIG. 3 is a block diagram of an exemplary component included in the system of FIG. 1.

FIG. 3 shows exemplary details of the selection circuit 26. The selection circuit 26 includes two optocouplers 40, 42 (e.g., photo MOSFETs), one for each connection between the IC subcircuits A, B and the input/output pin(s) 32. In the example shown, the system controller 24 generates a high (+5v) or low (0v) signal at the SEL A/B input. The high signal is generated based on voltage values of the configuration pin(s) 30. The high signal passes through a noninverter gate 46, thus impeding discharge of the supply voltage (+5v) of the first optocoupler 40, thereby disconnecting subcircuit A from the pin(s) 32. An inverter gate 44 converts the high signal to low, thereby causing the supply voltage (+5v) of the second optocoupler 42 to discharge, thereby connecting subcircuit B to pin(s) 32. A received low signal causes the opposite to occur.

The optocouplers' (photo MOSFETs) solid-state relays provide isolation between different signal types. The optocouplers' relays provide very low on-resistance, very high-output off-state impedance, high transient immunity, and high input-to-output insulation voltage.

In one embodiment, when there are more than two couplers (subcircuits) the controller uses additional SEL A/B signals, ex. SEL A/B/C/D signals, etc.

Figure 4:
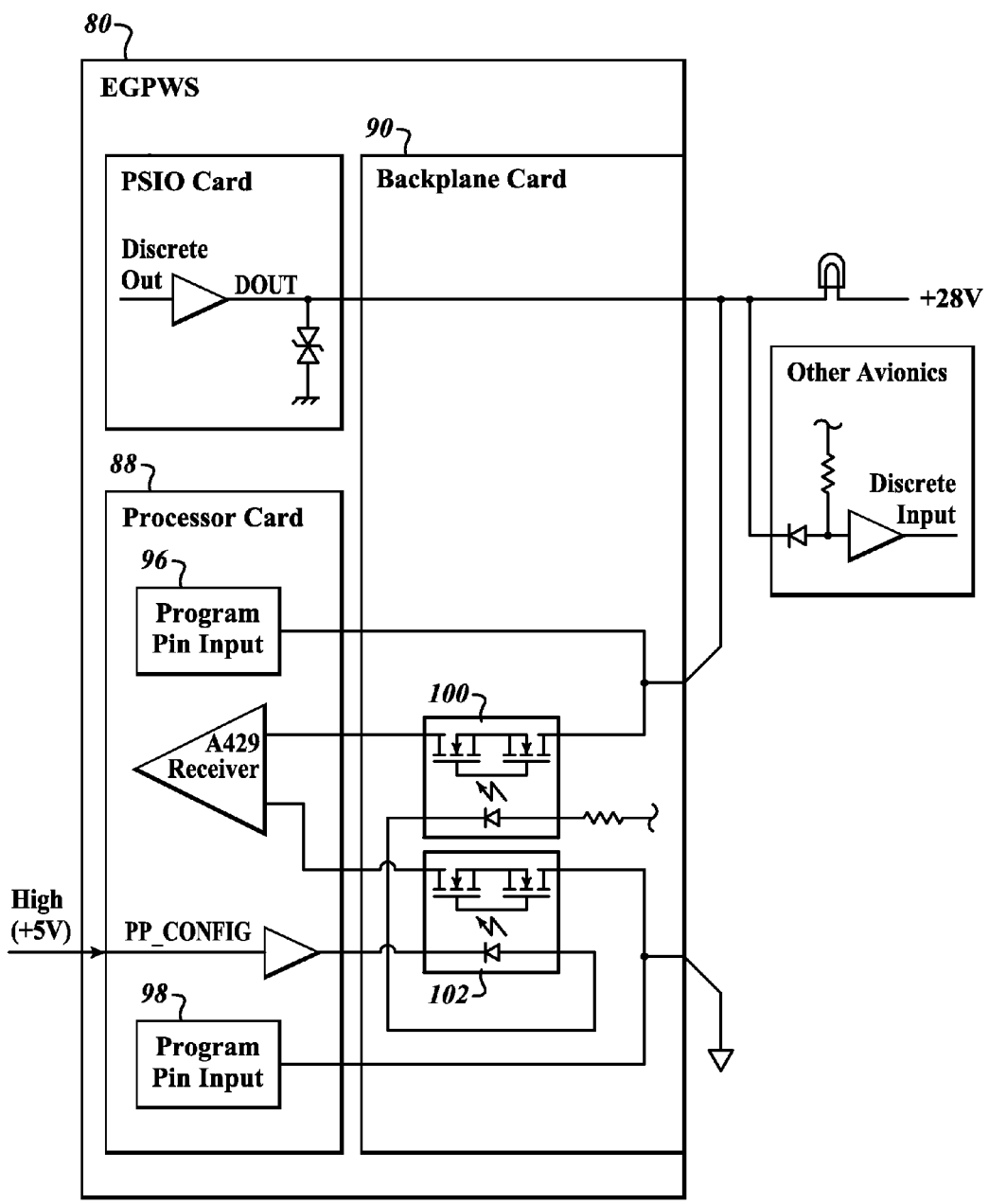
FIG. 4 shows an exemplary implementation of an exemplary avionics system interface formed in accordance with an embodiment of the present invention.
Figure 5:
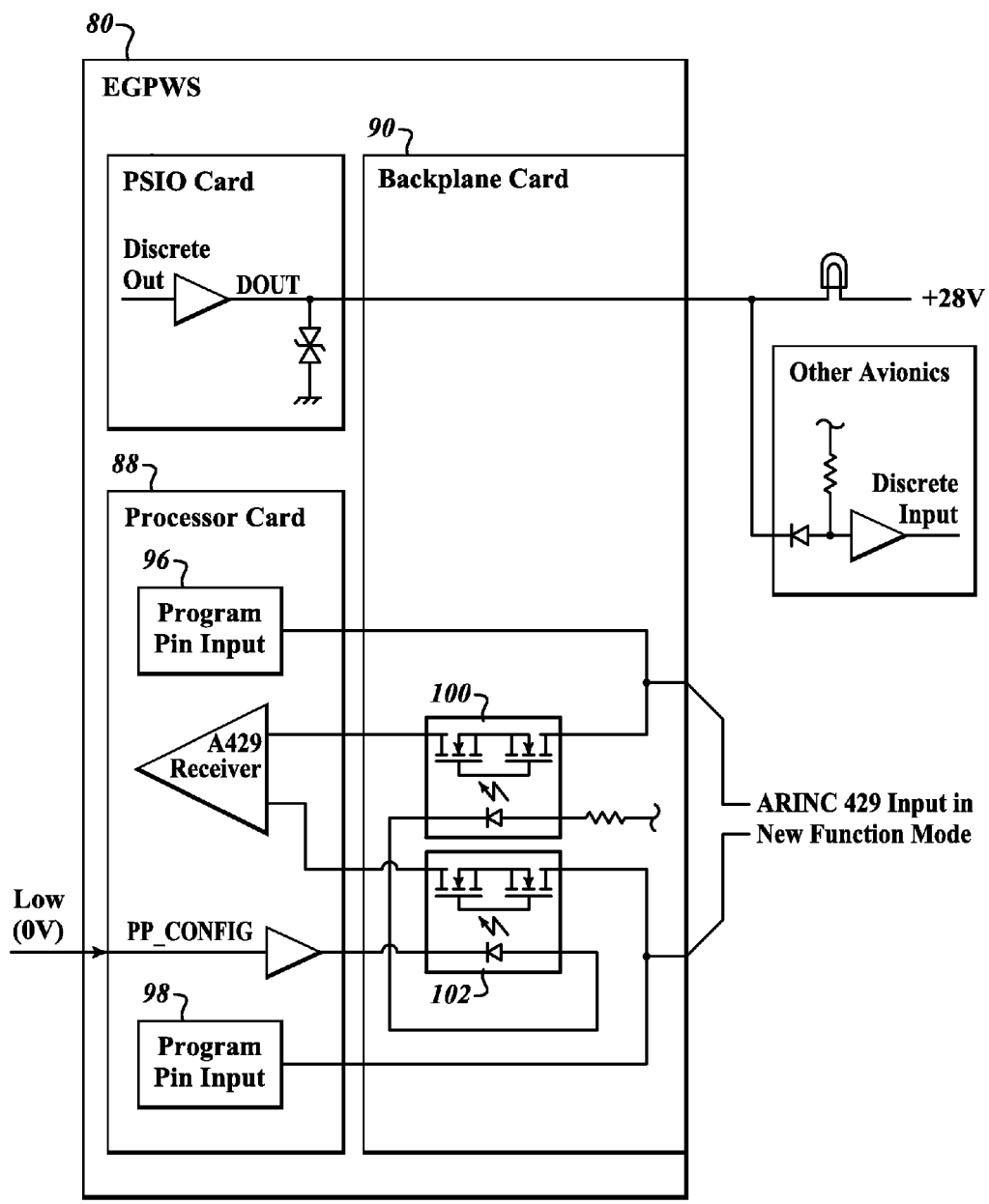
FIG. 5 shows an exemplary implementation of an exemplary avionics system interface formed in accordance with another embodiment of the present invention.

FIGS. 4 and 5 show an EGPWS 80 formed in accordance with an embodiment of the present invention. In FIG. 4, the EGPWS 80 has two multipurpose pins configured as Program Pin Inputs 96 and 98. The SEL A/B signal "PP_CONFIG" is high (+5V) which disconnects the ARINC 429 Receiver subcircuit from the multipurpose pin. In this configuration mode, the EGPWS 80 pins are used as program pins and either connected to aircraft ground or to discrete output subcircuits depending on the aircraft configuration. In FIG. 5, the EGPWS 80 has two multipurpose pins configured as ARINC 429 Receiver Inputs. The SEL A/B signal "PP_CONFIG" is low (0V) which connects the ARINC 429 Receiver subcircuit to the multipurpose pin. In this configuration mode, the EGPWS 80 pins are used as ARINC 429 Receiver and connected to an ARINC 429 Transmitter in the aircraft.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. An avionics system comprising:
   one or more configuration pins configured to receive one or more signals from an external source,
   one or more subcircuits;

one or more multipurpose input/output pins;
a memory device comprising a configuration index;
a controller coupled to the memory device and configured to determine a configuration mode based on one or more signals at one or more configuration pins and the configuration index; and
a selection circuit comprising an optocoupler and a photodiode, the selection circuit coupled to the controller and configured to connect one of the plurality of subcircuits with at least one of the multipurpose input/output pins, based on the determined configuration mode.

* * * * *